US008957578B2

(12) United States Patent
Lee

(10) Patent No.: US 8,957,578 B2
(45) Date of Patent: Feb. 17, 2015

(54) ORGANIC LIGHT EMITTING DISPLAY DEVICES AND METHODS OF MANUFACTURING ORGANIC LIGHT EMITTING DISPLAY DEVICES

(75) Inventor: Hyun-Shik Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 7 days.

(21) Appl. No.: 13/541,133

(22) Filed: Jul. 3, 2012

(65) Prior Publication Data

US 2013/0200780 A1 Aug. 8, 2013

(30) Foreign Application Priority Data

Feb. 6, 2012 (KR) .................. 10-2012-0012025

(51) Int. Cl.
*H01J 1/62* (2006.01)
*H01J 63/04* (2006.01)
*B82Y 20/00* (2011.01)

(52) U.S. Cl.
CPC ...................................... *B82Y 20/00* (2013.01)
USPC ........... 313/504; 313/483; 313/500; 313/501; 313/502; 313/503; 313/505; 313/506

(58) Field of Classification Search
None
See application file for complete search history.

(56) References Cited

U.S. PATENT DOCUMENTS

| 6,424,418 B2 * | 7/2002 | Kawabata et al. ............ 356/445 |
| 6,891,322 B2 | 5/2005 | Lee et al. |
| 7,492,458 B2 | 2/2009 | Malak |
| 8,809,889 B2 * | 8/2014 | Lee et al. ......................... 257/98 |

FOREIGN PATENT DOCUMENTS

| JP | 2007-035430 A | 2/2007 |
| KR | 10-2002-0065281 A | 8/2002 |

OTHER PUBLICATIONS

Machine translation of JP 2007-035430 (Omi et al).*

* cited by examiner

*Primary Examiner* — Natalie Walford
(74) *Attorney, Agent, or Firm* — Knobbe Martens Olson & Bear LLP

(57) ABSTRACT

An organic light emitting display device may include a substrate, a first electrode, a light emitting structure, a second electrode and a nanostructure. The first electrode may be disposed over the substrate. The light emitting structure may be disposed over the first electrode. The second electrode may be disposed over the light emitting structure. A plurality of nanoparticles may be disposed over the second electrode. The plurality of nanoparticles is capable of causing surface plasmon resonance by light. At least some of the plurality of nanoparticles have materials, sizes and shapes determined to cause surface plasmon resonance by light having a predetermined wavelength and emitted from the light emitting structure.

19 Claims, 9 Drawing Sheets

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATION

This application claims priority under 35 USC §119 to Korean Patent Application No. 10-2012-0012025 filed on Feb. 6, 2012 in the Korean Intellectual Property Office (KIPO), the contents of which are herein incorporated by reference in its entirety.

BACKGROUND

1. Field

The present disclosure relates to organic light emitting display devices and methods of manufacturing organic light emitting display devices.

2. Related Technology

An organic light emitting display (OLED) device may display desired information such as images, letters and/or characters using a light generated by combining holes provided from an anode with electrons provided from a cathode in an organic layer thereof. The OLED device may ensure a relatively large view angle, rapid response speed, small thickness, low power consumption, etc. Accordingly the OLED device may be certainly expected to become the most prospecting one among the next-generation display devices.

In an OLED device, about 80% of light generated in the organic light emitting layer may be trapped and dissipated in the OLED device, and only about 20% of light may be transmitted out of the device, so that the OLED device may have a relatively low optical efficiency. Accordingly, in order to enhance the optical efficiency of the OLED device, light trapped in the OLED device may need to be further transmitted out of the device. The foregoing discussion is to provide general background information, and does not constitute an admission of prior art.

SUMMARY

Embodiments provide organic light emitting display devices ensuring optical efficiency by using surface plasmon resonance mechanism.

Embodiments provide methods of manufacturing organic light emitting display devices having enhanced optical efficiency by using surface plasmon resonance mechanism.

According to embodiments, there is provided an organic light emitting display device including a substrate, a first electrode, a light emitting structure, a second electrode and a plurality of nanoparticles. The first electrode may be disposed over the substrate. The light emitting structure may be disposed over the first electrode. The second electrode may be disposed over the light emitting structure. The plurality of nanoparticles may be disposed over the second electrode. The plurality of nanoparticles may be capable of causing surface plasmon resonance by light. At least some of the plurality of nanoparticles may have materials, sizes and shapes determined to cause surface plasmon resonance of light having a predetermined wavelength and emitted from the light emitting structure.

In embodiments, the organic light emitting display device may further comprise a capping layer disposed over the second electrode, and the plurality of nanoparticles may be disposed over the capping layer.

In embodiments, the organic light emitting display device may further comprise a capping layer disposed over the second electrode to cover the plurality of nanoparticles, and a refractive index of the capping layer may be determined such that the nanoparticles cause the surface plasmon resonance by the light having the predetermined wavelength.

In embodiments, the nanoparticles may include gold, silver, copper, silicon oxide, etc. The nanoparticles may include sphere-shaped particles, rod-shaped particles, core/shell-shaped particles, etc. The nanoparticles are arranged to form a single layer.

In embodiments, the device may include a first sub-pixel region, a second sub-pixel region and a third sub-pixel region, and the plurality of nanoparticles may include first nanoparticles, second nanoparticles and third nanoparticles. The first nanoparticles may cause surface plasmon resonance by red light from the first sub-pixel region, the second nanoparticles may cause surface plasmon resonance by green light from the second sub-pixel region, and the third nanoparticles may cause surface plasmon resonance by blue light from the third sub-pixel region.

In embodiments, the first nanoparticles may include rod-shaped particles containing gold, the second nanoparticles may include sphere-shaped particles containing silver or copper, or core/shell-shaped particles containing gold as the core and silicon oxide as the shell, and the third nanoparticles may include sphere-shaped particles containing silver or an alloy of silver and gold.

According to embodiments, there is provided an organic light emitting display device including a substrate, a first electrode, a light emitting structure, a second electrode, a plurality of nanoparticles and an overcoat layer. The first electrode may be disposed over the substrate. The light emitting structure may be disposed over the first electrode. The second electrode may be disposed over the light emitting structure. The plurality of nanoparticles may be disposed between the substrate and the light emitting structure. The plurality of nanoparticles may be capable of causing surface plasmon resonance by light. The overcoat layer may be positioned to cover the plurality of nanoparticles. At least some of the plurality of nanoparticles may have materials, sizes and shapes determined to cause surface plasmon resonance by light having a predetermined wavelength and emitted from the light emitting structure.

In embodiments, the overcoat layer may include a siloxane based organic material, a siloxane based organic material combined with a metal, a metaloxane based organic material, etc.

In embodiments, the plurality of nanoparticles may be disposed between the substrate and the first electrode.

In embodiments, the plurality of nanoparticles may be disposed between the first electrode and the light emitting structure.

In embodiments, the nanoparticles may include gold, silver, copper, silicon oxide, etc. and, the nanoparticles may include sphere-shaped particles, rod-shaped particles and core/shell-shaped particles. The nanoparticles may be arranged to form a single layer.

In embodiments, the device may include a display region including a first sub-pixel region, a second sub-pixel region and a third sub-pixel region, and the plurality of nanoparticles may include first nanoparticles, second nanoparticles and third nanoparticles. The first nanoparticles may include rod-shaped particles containing gold to cause surface plasmon resonance by red light from the first sub-pixel region, the second nanoparticles may include sphere-shaped particles containing silver or copper, or core/shell-shaped particles containing gold and silicon oxide to cause surface plasmon resonance by green light from the second sub-pixel region, and the third nanoparticles may include sphere-shaped particles containing silver or an alloy of silver and gold to cause surface plasmon resonance by blue light from the third sub-pixel region.

According to embodiments, there is provided a method of manufacturing an organic light emitting display device. In the method, a first electrode may be formed over a substrate. A light emitting structure may be formed over the first electrode. A second electrode may be formed over the light emitting structure. A nanoparticle structure may be formed over the second electrode. The nanoparticle structure may include a plurality of nanoparticles capable of causing surface plasmon resonance by light. An overcoat layer may be formed to cover the nanoparticle structure. At least some of the plurality of nanoparticles may have materials, sizes and shapes determined to cause surface plasmon resonance by light having a predetermined wavelength and emitted from the light emitting structure.

In embodiments, forming a nanoparticle structure may include providing a coating solution containing at least one of the nanoparticles, coating the coating solution by a spray coating process, a slit coating process or a spin coating process and performing a baking process to remove a solvent from the coating solution.

In embodiments, forming the coating solution may include obtaining a refractive index of the overcoat layer, determining sizes and size distributions of the nanoparticles based on the refractive index and adding the solvent to the nanoparticles. The solvent may include butyl alcohol.

In embodiments, the nanoparticle structure may include the first nanoparticles causing surface plasmon resonance by red light from the first sub-pixel region, the second nanoparticles causing surface plasmon resonance by green light from the second sub-pixel region, and the third nanoparticles causing surface plasmon resonance from blue light from the third sub-pixel region.

In embodiments, the device may include a display region and a non-display region. The display region may have a first sub-pixel region, a second sub-pixel region and a third sub-pixel region, each of which emits light having a wavelength different from those of light emitted from the other sub-pixel regions. The nanoparticle structure may be formed in the first sub-pixel region, the second sub-pixel region and the third sub-pixel region, simultaneously.

In embodiments, a capping layer may be further formed over the second electrode, and the nanoparticle structure may be disposed over the capping layer.

According to embodiments, when an organic light emitting display device has a bottom emission type, the organic light emitting display device may include a nanoparticle structure and first to third overcoat layers. A wavelength of light that may be absorbed and emitted from the nanoparticle structure may vary depending on refractive indexes of the first, second and third overcoat layers and the materials and sizes of the first to third nanoparticles. For example, the first nanoparticles in a first sub-pixel region I may absorb light, and then may emit light having a wavelength corresponding to a red color. The second nanoparticles in a second sub-pixel region II and the third nanoparticles in a third sub-pixel region III may absorb light, and then may emit light having wavelengths corresponding to a green color and a blue color, respectively. That is, the first nanoparticles may cause surface plasmon resonance by red light from the first sub-pixel region I, and the second nanoparticles and the third nanoparticles may cause surface plasmon resonance by green light and the from the second sub-pixel region II and blue light from the third sub-pixel region III, respectively. Therefore, the optical efficiency in the first, second and third sub-pixel regions I, II and III may be improved. Thus, the required power for generating light having the same brightness may decrease.

BRIEF DESCRIPTION OF THE DRAWINGS

Embodiments will be more clearly understood from the following detailed description taken in conjunction with the accompanying drawings.

FIG. 1 is a cross-sectional view illustrating an organic light emitting display device in accordance with embodiments;

FIG. 2 is a cross-sectional view illustrating an organic light emitting display device in accordance with some embodiments;

FIG. 3 is a cross-sectional view illustrating an organic light emitting display device in accordance with some embodiments;

FIG. 4 is a cross-sectional view illustrating an organic light emitting display device in accordance with some embodiments; and FIGS. 5 to 9 are cross-sectional views illustrating a method of manufacturing an organic light emitting display device in accordance with embodiments.

DESCRIPTION OF EMBODIMENTS

Figure 1:
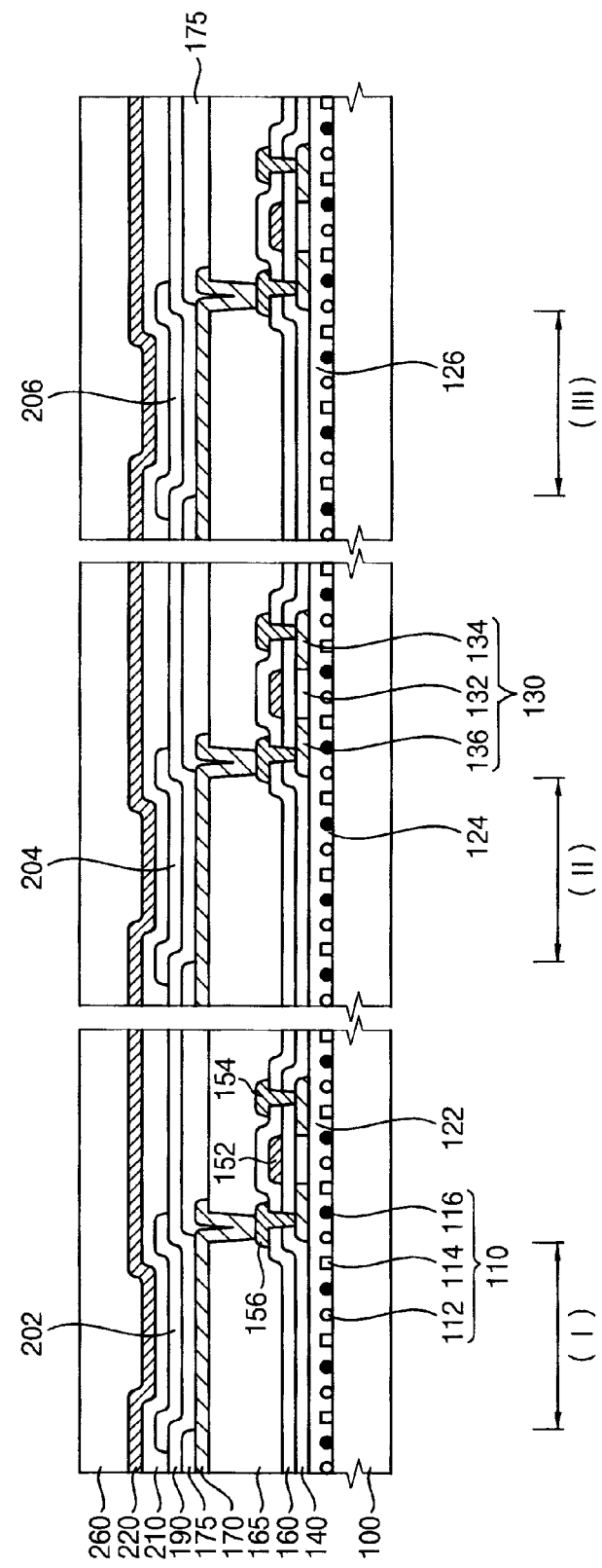
FIGS. 1 to 8 represent non-limiting, embodiments as described herein.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an organic light emitting display device in accordance with embodiments.

Referring to FIG. 1, the organic light emitting display device in accordance with embodiments may include a first substrate 100, a nanoparticle structure 110, overcoat layers 122, 124 and 126, a switching structure, a first electrode 170, a light emitting structure, a second electrode 220, etc. For example, the organic light emitting display device in accordance with an embodiment illustrated in FIG. 1 may be a bottom emission type display.

In embodiments, the organic light emitting display device may include a display region where the light emitting structure may be positioned and a non-display region adjacent to the display region. The display region of the organic light emitting display device may include a first sub-pixel region I, a second sub-pixel region II and a third sub-pixel region III. For example, the first sub-pixel region I, the second sub-pixel region II and the third sub-pixel region III of the organic light emitting display device may correspond to red light emitting region, green light emitting region and blue light emitting region, blue light, respectively. That is, the light emitting structures in the first sub-pixel region I, the second sub-pixel region II and the third sub-pixel region III may emit the red light, the green light and the blue light, respectively.

Overcoat layers 122, 124 and 126 may be disposed on the first substrate 100 to cover the nanoparticle structure 110, and the switching structure may be disposed on the overcoat layers 122, 124 and 126. The first electrode 170 may be disposed on the switching structure to be electrically connected to the switching structure. The light emitting structure may be disposed between the first electrode 170 and the second electrode 220.

The first substrate 100 may include a transparent insulating material. For example, the first substrate 100 may include a glass substrate, a quartz substrate, a transparent resin substrate, a transparent ceramic substrate, etc. In some embodiments, the first substrate 100 may include a flexible substrate.

The nanoparticle structure 110 may include first nanoparticles 112, second nanoparticles 114 and third nanoparticles 116 that may be disposed on the first substrate 100. In this case, the nanoparticle structure 110 including the first, second and third nanoparticles 112, 114 and 116 may be disposed in all of the first, second and third sub-pixel regions I, II and III.

In embodiments, the first nanoparticles 112 in the first sub-pixel region I may absorb light emitted from a first organic light emitting layer 202, and then may emit light having a wavelength corresponding to the red color. Whereas the second nanoparticles 114 and third nanoparticles 116 disposed in the first sub-pixel region may not resonate with the light emitted from the first organic light emitting layer 202. The second nanoparticles 114 in the second sub-pixel region II may absorb light emitted from a second organic light emitting layer 204, and then may emit light having a wavelength corresponding to the green color, and the third nanoparticles 116 in the third sub-pixel region III may absorb light emitted from a third organic light emitting layer 206, and then may emit light having a wavelength corresponding to the blue color. That is, the first nanoparticles 112 may cause surface plasmon resonance by the red light, and the second nanoparticles 114 and the third nanoparticles 116 may cause surface plasmon resonance by the green light and the blue light, respectively.

Materials, sizes and shapes of the first, second and third nanoparticles 112, 114 and 116 may be determined or chosen depending on the wavelength of light in the surface plasmon resonance. For example, the first, second and third nanoparticles 112, 114 and 116 may include gold (Au), silver (Ag), copper (Cu), silicon oxide, etc. These materials may be used alone or in a combination thereof. The first, second and third nanoparticles 112, 114 and 116 may include sphere-shaped particles, rod-shaped particles, core/shell shaped particles, etc. In embodiments, the first nanoparticles 112 may include rod-shaped particles containing gold (Au). A ratio of length to width of a rod-shaped particle may be about 2:1. The second nanoparticles 114 may include sphere-shaped particles containing gold (Au) or silver (Ag) or core/shell shaped particles having the core containing silicon oxide and the shell containing gold (Au). The third nanoparticles 116 may include sphere-shaped particles containing silver (Ag), gold (Au), or an alloy of silver.

In embodiments, the nanoparticle structure 110 including the first, second and third nanoparticles 112, 114 and 116 may be disposed as a single layer. For example, the first, second and third nanoparticles 112, 114 and 116 may be uniformly distributed on the first substrate 100. However, the first, second and third nanoparticles 112, 114 and 116 may not be stacked in a direction substantially perpendicular to the substrate 100. Therefore, light proceeding in the direction substantially perpendicular to the substrate 100 may pass or meet a single particle which is one of the first, second and third nanoparticles 112, 114 and 116. If the nanoparticle structure 110 includes a stacked structure of nanoparticles, for example, light resonated with the first nanoparticle may be absorbed at another nanoparticle stacked over the first nanoparticle, such as, the second nanoparticle or the third nanoparticle, and then optical efficiency of the organic light emitting display device may be reduced. Accordingly, when the nanoparticle structure 110 includes the nanoparticles 112, 114 and 116 arranged as the single layer, the optical efficiency of the organic light emitting display device may increase.

The first overcoat layer 122, the second overcoat layer 124 and the third overcoat layer 126 may be disposed on the substrate 100 in the first sub-pixel region I, the second sub-pixel region II and the third sub-pixel region III respectively, and may substantially cover the nanoparticle structure 110. For example, the first, second and third overcoat layers 122, 124 and 126 may include a siloxane based organic material, a siloxane based organic material combined with a metal, a metaloxane based organic material and/or a combination thereof. In embodiments, the first, second and third overcoat layers 122, 124 and 126 may include substantially the same material. In some embodiments, the first, second and third overcoat layers 122, 124 and 126 may include materials different from each other. Thicknesses and refractive indexes of the first, second and third overcoat layers 122, 124 and 126 may vary depending on a predetermined wavelength of light in the surface plasmon resonance. For example, when the first, second and third overcoat layers 122, 124 and 126 have refractive indexes less than about 1.6, the first, second and third overcoat layers 122, 124 and 126 may have a thickness less than about 300 nm.

The first, second and third overcoat layers 122, 124 and 126 may have upper faces which may be substantially flat. Therefore, the first, second and third overcoat layers 122, 124 and 126 may improve a flatness of the substrate 100.

When the organic light emitting display device has an active matrix type, the switching structure may be disposed between the first, the second and third overcoat layers 122, 124 and 126 and the first electrode 170. In embodiments, the switching structure may include a switching device such as a transistor and a plurality of insulation layers.

When the switching device in the switching structure includes the thin film transistor, the switching device may include a gate electrode 152, a source electrode 154, a drain electrode 156, a semiconductor layer 130, etc.

A gate signal may be applied to the gate electrode 152, and a data signal may be applied to the source electrode 154. The drain electrode 156 may electrically contact the first electrode 170, and the semiconductor layer 130 may electrically contact both the source electrode 154 and the drain electrode 156. The semiconductor layer 130 may include a source region 134 contacting the source electrode 154, a drain region 136 contacting the drain electrode 156 and a channel region 132 locating between the source region 134 and the drain region 136.

A gate insulation layer 140 electrically isolating the gate electrode 152 from the semiconductor layer 130 may be disposed on the semiconductor layer 130, and a first insulation layer 160 may be disposed on the gate insulation layer 140 to cover the gate electrode 152.

In the organic light emitting display device described with reference to FIG. 1, the switching device including the thin film transistor may have a top gate structure in which the gate electrode 152 may be disposed on the semiconductor layer 130, however, the configuration of the switching device may not be limited thereto. For example, the switching device may have a bottom gate structure in which the gate electrode 152 may be disposed under the semiconductor layer 130, or may include the oxide semiconductor device having the active layer containing semiconductor oxide.

The second insulation layer 165 in the switching device may be disposed on the first insulation layer 160 to cover the source electrode 154 and the drain electrode 156. The second insulation layer 165 may have an upper face which may be substantially flat.

Referring to FIG. 1, the light emitting structure may include a hole transfer layer 190, first to third organic light emitting layers 202, 204 and 206, an electron transfer layer 210, etc. In embodiments, the first organic light emitting layer 202 may include an organic material, a mixture of an organic material and/or an inorganic material generating the red light, the second organic light emitting layer 204 may include an organic material, a mixture of an organic material and/or an inorganic material generating the green light, and the third organic light emitting layer 206 may include an organic material, a mixture of an organic material and/or an inorganic material generating the blue light. In some embodiments, the first, second and third organic light emitting layers 202, 204 and 206 may include a stacked structure including light emitting layers for a white color of light.

The first electrode 170 may be disposed between the switching structure and the light emitting structure, and the second electrode 220 may be disposed between the light emitting structure and the second substrate 260. A pixel defining layer 175 may be disposed between the switching structure and the light emitting structure in a region where the first electrode 170 may not be disposed. In embodiments, the first electrode 170 may serve as an anode for providing holes into a hole transfer layer 190 of the light emitting structure, and the second electrode 220 may serve as a cathode for supplying electrons into an electron transfer layer 210. However, the inventive concept may not be limited to the above-described construction. In some embodiments, the first electrode 170 and the second electrode 220 may serve as a cathode and an anode, respectively. The first electrode 170 may be a transparent electrode or a semi-transparent electrode in accordance with an emission type of the organic light emitting display device, and the second electrode 220 may be a reflective electrode. For example, the first electrode 170 may include a transparent conductive material such as indium tin oxide (ITO) and indium zinc oxide (IZO), and the second electrode 220 may include metal and/or alloy having a relatively high reflectivity such as silver (Ag), aluminum (Al), platinum (Pt), gold (Au), chrome (Cr), tungsten (W), molybdenum (Mo), titanium (Ti), palladium (Pa), an alloy thereof, etc.

The second substrate 260 may be disposed on the second electrode 220. The second substrate 260 may include a transparent substrate. For example, the second substrate 260 may include a glass substrate, a transparent resin substrate, etc. Alternatively, the second substrate 260 may include a flexible substrate.

According to embodiments, when the organic light emitting display device has a bottom emission type, the organic light emitting display device may include the nanoparticle structure 110 and the first, second and third overcoat layers 122, 124 and 126. The wavelength of light that may be absorbed and emitted from the nanoparticle structure 100 may vary depending on the refractive indexes of the first, second and third overcoat layers 122, 124 and 126 and depending on the materials and the sizes of the first, second and third nanoparticles 112, 114 and 116. For example, the first nanoparticles 112 in the first sub-pixel region I may absorb light, and then may emit light having a wavelength corresponding to the red color. The second nanoparticles 114 in the second sub-pixel region II and the third nanoparticles 116 in the third sub-pixel region III may absorb light, and then may emit light having wavelengths corresponding to the green color and the blue color, respectively. That is, the first nanoparticles 112 may cause surface plasmon resonance of the red light in the first sub-pixel region I, and the second nanoparticles 114 and the third nanoparticles 116 may cause surface plasmon resonance of the green light in the second sub-pixel region II and the blue light in the third sub-pixel region III, respectively. Therefore, the optical efficiency in the first, second and third sub-pixel regions I, II and III may be improved. Thus, the required power for generating light having the same brightness may decrease.

Figure 2:
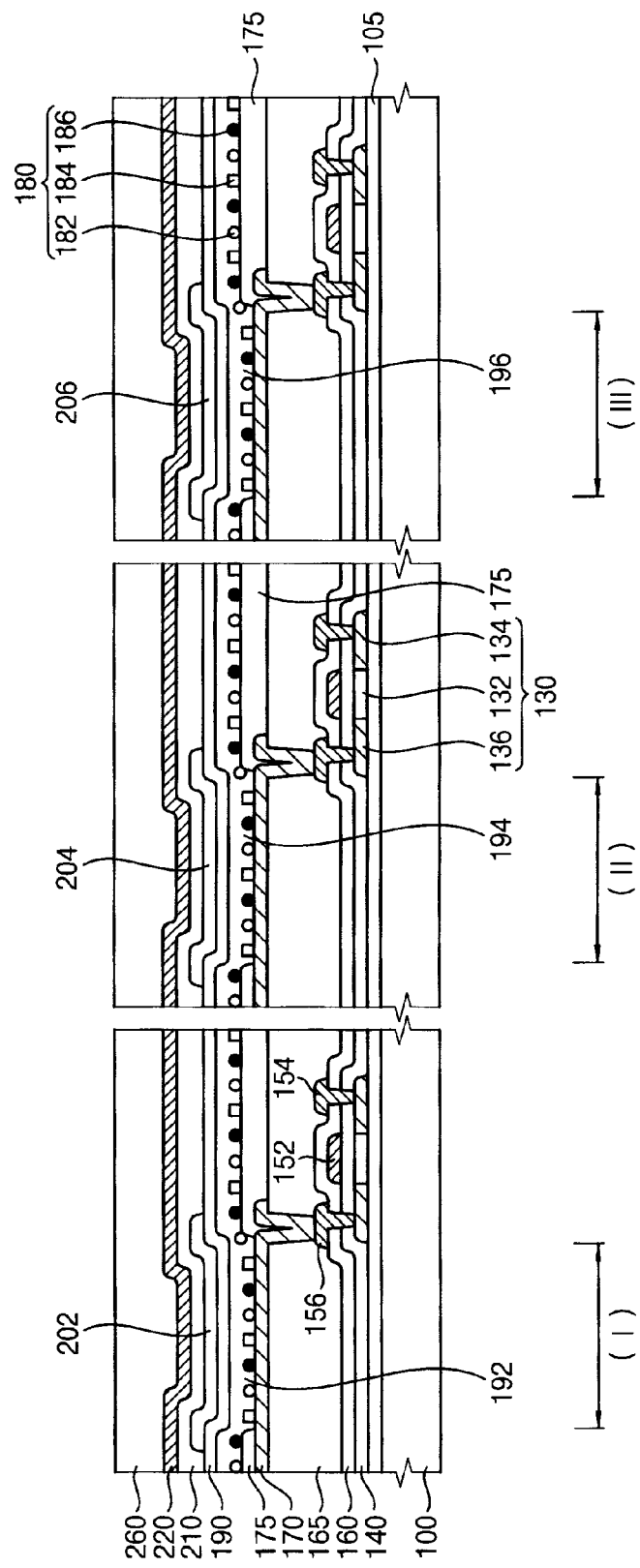

FIG. 2 is a cross-sectional view illustrating an organic light emitting display device in accordance with some embodiments.

Referring to FIG. 2, the organic light emitting display device may include a first substrate 100, a switching structure, a first electrode 170, a nanoparticle structure 180, first to third overcoat layers 192, 194 and 196, a light emitting structure, a second electrode 220, etc. The organic light emitting display device may have a bottom emission type. The organic light emitting display device illustrated in FIG. 2 may have a construction substantially the same as or substantially similar to that of the organic light emitting display device with reference to FIG. 1 except for the nanoparticle structure 180 and the overcoat layers 192, 194 and 196.

The switching structure may be positioned on the first substrate 100 having a buffer layer 105, and a second insulation layer 165 may be disposed to cover the switching structure. The first electrode 170 may be disposed on the second insulation layer 165 in a display region of the organic light emitting display device, and a pixel defining layer 175 may be located in a non-display region.

In embodiments, the nanoparticle structure 180 may include first nanoparticles 182, second nanoparticles 184 and third nanoparticles 186. The nanoparticle structure 180 may be disposed on the first electrode 170 and the pixel defining layer 175. In this case, the first overcoat layer 192, the second overcoat layer 194 and the third overcoat layer 196 may be disposed on the first electrode 170 in a first sub-pixel region I, a second sub-pixel region II and a third sub-pixel region III, respectively, to cover the nanoparticle structure 180.

According to embodiments, although positions of the nanoparticle structure 180 and the first, second and third overcoat layers 192, 194 and 196 may be different from those in other embodiments, surface plasmon resonance of red light, green light and blue light may be generated in the first sub-pixel region I, the second sub-pixel region II and the third sub-pixel region III, respectively. The nanoparticle structure 180 may be disposed adjacent to the light emitting structure, so that light is less trapped in the light emitting structure and easily transmitted toward the outside. Therefore, the optical efficiency in the first, second and third sub-pixel regions I, II and III may be enhanced.

Figure 3:
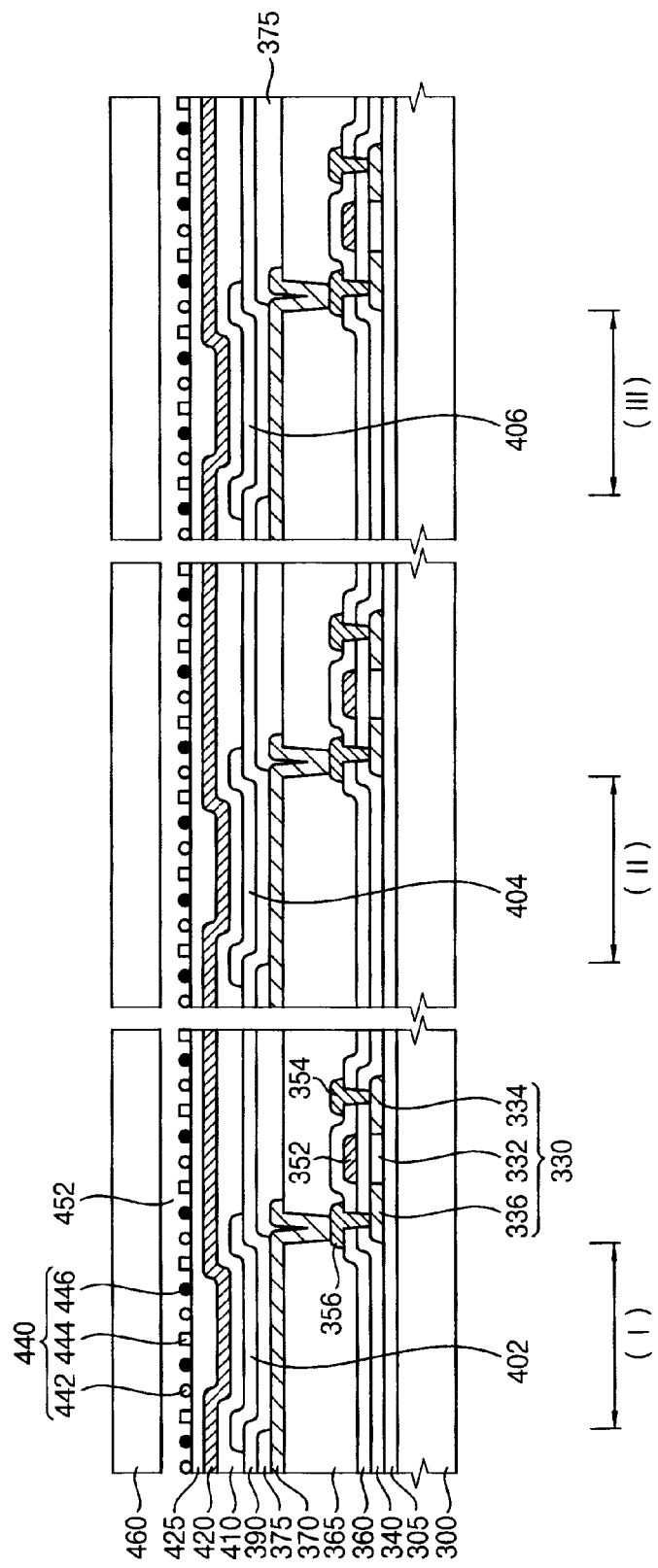

FIG. 3 is a cross-sectional view illustrating an organic light emitting display device in accordance with some embodiments.

Referring to FIG. 3, the organic light emitting display device may include a first substrate 300, a switching structure, a first electrode 370, a light emitting structure, a second electrode 420, a nanoparticle structure 440, etc. The organic light emitting display device may have a top emission type.

The organic light emitting display device illustrated in FIG. 3 may have the switching structure and the light emitting structure substantially the same as or substantially similar to those of the organic light emitting display device with reference to FIG. 1, and thus a detailed description thereof may be omitted.

The organic light emitting display device may include a display region and a non-display region, and the display region may have a first sub-pixel region I, a second sub-pixel region II and a third sub-pixel region III.

The switching structure may be disposed on the first substrate 300 having a buffer layer 305, and the first electrode 370, the light emitting structure and the second electrode 420 may be sequentially stacked on the switching structure. The nanoparticle structure 440 may be disposed on the second electrode 420.

The first substrate 300 may include a transparent insulation substrate such as a glass substrate, a quartz substrate, a transparent resin substrate, a transparent ceramic substrate, etc. When the organic light emitting display device has an active matrix type, the switching structure may be located on the first substrate 300. When the switching structure has a thin film transistor, the switching structure may include a gate electrode 352, a source electrode 354, a drain electrode 356, a semiconductor layer 330, etc. The semiconductor layer 330 may include a source region 334 contacting the source electrode 354, a drain region 336 contacting the drain electrode 356 and a channel region 332 locating between the source region 334 and the drain region 336.

A gate insulation layer 340 may be disposed on the semiconductor layer 330, and a first insulation layer 360 may be positioned on the gate insulation layer 340 to cover the gate electrode 352.

In the switching structure described with reference to FIG. 3, the switching structure may include the thin film transistor having a top gate structure. However, the configuration of the switching structure may not be limited thereto. For example, the switching structure may have a bottom gate structure.

The second insulation layer 365 may be disposed on the first insulation layer 360 to cover the source electrode 354 and the drain electrode 356.

As illustrated in FIG. 3, the light emitting structure may include a hole transfer layer 390, first to third organic light emitting layers 402, 404 and 406, an electron transfer layer 410, etc. The first, second and third organic light emitting layers 402, 404 and 406 may include an organic material, a mixture of an organic material and/or an inorganic material generating red light, green light and blue light in the first, second and third sub-pixel regions I, II and III, respectively.

The first electrode 370 may be disposed between the switching structure and the light emitting structure, and the second electrode 420 may be positioned between the light emitting structure and the second substrate 460. The first electrode 370 may include a reflective electrode, and the second electrode 420 may include a transparent electrode or a semi-transparent electrode in accordance with an emission type of the organic light emitting display device.

A capping layer 425 may be disposed on the second electrode 420 to cover the second electrode 420 and the light emitting structure. The capping layer 425 may prevent impurities or moisture from penetrating into the light emitting structure, thereby extending a life time of the organic light emitting display device. For example, the capping layer 425 may include low molecular weight organic material.

The nanoparticle structure 440 may include first nanoparticles 442, second nanoparticles 444 and third nanoparticles 446 disposed on the capping layer 425.

In embodiments, the first nanoparticles 442 in the first sub-pixel region I may absorb light emitted from the first organic light emitting layer 402, and then may emit light having a wavelength corresponding to the red color. The second nanoparticles 444 in the second sub-pixel region II may absorb light emitted from the second organic light emitting layer 404, and then may emit light having the wavelength corresponding to the green color, and the third nanoparticles 446 in the third sub-pixel region III may absorb light emitted from the third organic light emitting layer 406, and then may emit light having the wavelength corresponding to the blue color. Materials, sizes and shapes of the first, second and third nanoparticles 442, 444 and 446 may be determined depending on the wavelength of light in the surface plasmon resonance.

In embodiments, the first nanoparticles 442, the second nanoparticles 444 and the third nanoparticles 446 illustrated in FIG. 3 may be substantially the same as or substantially similar to the first nanoparticles 112, the second nanoparticles 114 and the third nanoparticles 116 illustrated in FIG. 1. The nanoparticles may be arranged as a single layer.

The second substrate 460 may be disposed on the nanoparticle structure 440. The second substrate 460 may include a transparent substrate. For example, the second substrate 460 may include a glass substrate, a transparent resin substrate, etc. The second substrate 460 may contact the nanoparticle structure 440, or may not contact the nanoparticle structure 440.

A polarization film (not illustrated) may be disposed on the second substrate 460.

According to embodiments, when the organic light emitting display device has a top emission type, the nanoparticle structure 440 may be located on the capping layer 425 in the first, second and third sub-pixel regions I, II and III. The wavelength of light, that may be absorbed and emitted from the nanoparticle structure 440, may vary in accordance with the materials and the sizes of the first, second and third nanoparticles 442, 444 and 446. Accordingly, the optical efficiency in the first, second and third sub-pixel regions I, II and III may be improved, and a required power for generating light having the same brightness may be reduced.

Figure 4:
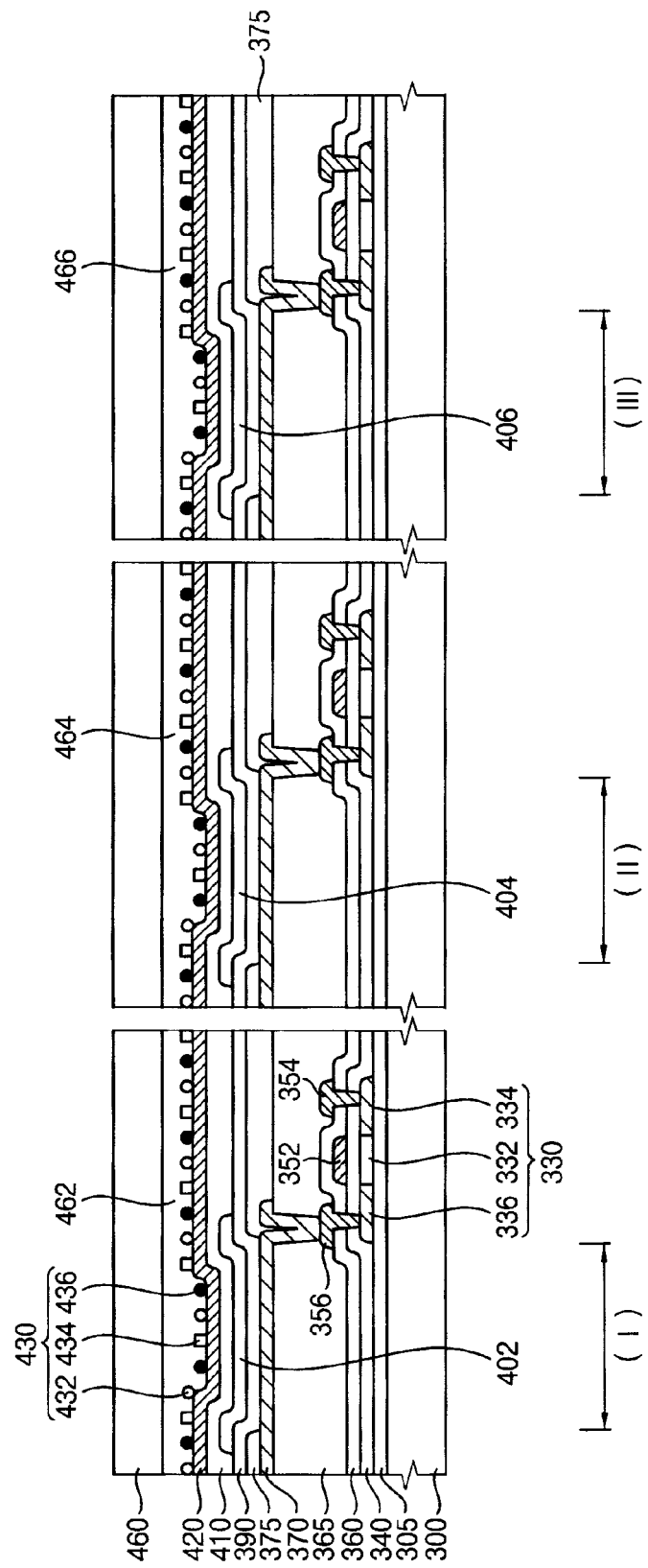

FIG. 4 is a cross-sectional view illustrating an organic light emitting display device in accordance with some embodiments.

Referring to FIG. 4, the organic light emitting display device may include a first substrate 300, a switching structure, a first electrode 370, a light emitting structure, a second electrode 420, a nanoparticle structure 430, etc., and may have a top emission type. The organic light emitting display device illustrated in FIG. 4 may have a construction substantially the same as or substantially similar to that of the organic light emitting display device with reference to FIG. 3 except for the nanoparticle structure 430 and capping layers 462, 464 and 466.

The switching structure may be disposed on the first substrate 300 having a buffer layer 305, and a light emitting structure may be positioned on the switching structure.

In embodiments, the nanoparticle structure 430 including first nanoparticles 432, second nanoparticles 434 and third nanoparticles 436 may be disposed on the second electrode 420. For example, the first capping layer 462, the second capping layer 464 and the third capping layer 466 may be located on the second electrode 420 in a first sub-pixel region I, a second sub-pixel region II and a third sub-pixel region III to cover the nanoparticle structure 430. The first, second and third capping layers 462, 464 and 466 may also cover the second electrode 420 and the light emitting structure.

According to embodiments, although positions of the nanoparticle structure 430, and the first, second and third capping layers 462, 464 and 466 may be different from those in other embodiments, surface plasmon resonance of the red light, the green light and the blue light may be generated in the first sub-pixel region I, the second sub-pixel region II and the third sub-pixel region III, respectively.

FIGS. 5 to 9 are cross-sectional views illustrating a method of manufacturing an organic light emitting display device in accordance with embodiments. The organic light emitting display device obtained by the method illustrated in FIGS. 5 to 9 may have a construction substantially the same as or substantially similar to that of the organic light emitting display device described with reference to FIG. 1. However, those ordinary skilled in the art would understand that the method according to embodiments may be properly and easily modified to manufacture one of the organic light emitting display devices described with reference to FIG. 2 to FIG. 4.

Figure 5:
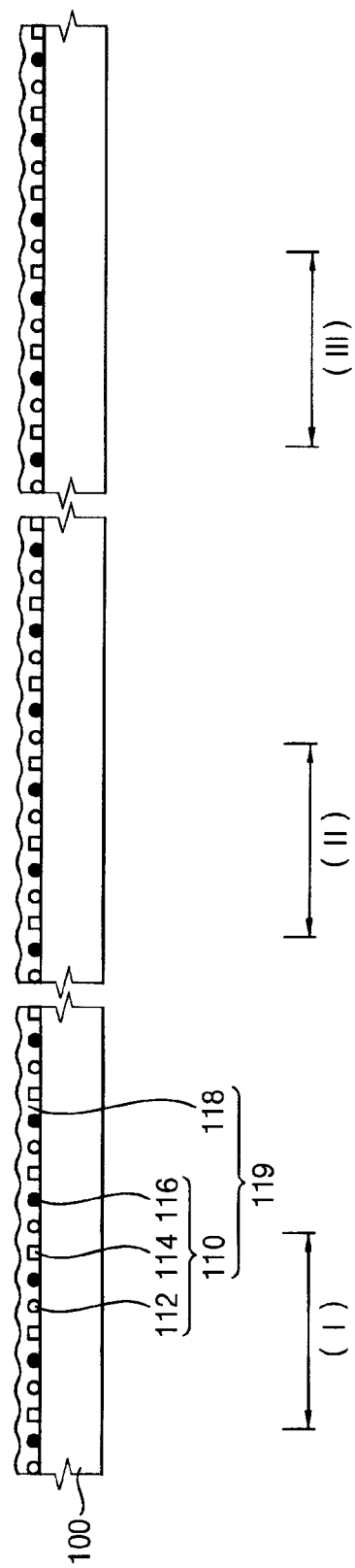

Referring to FIG. 5, a coating layer 119 containing nanoparticles may be formed on a first substrate 100.

The first substrate 100 may be formed using a transparent insulation material. In embodiments, nanoparticles and a sol containing an oxide material may be added into an alcohol solution such as butyl alcohol solution to obtain a coating solution. The sol containing the oxide material may allow the coating solution to have a predetermined viscosity, so that handing the coating solution may be easy. The nanoparticles in the coating solution may include first nanoparticles 112, second nanoparticles 114 and third nanoparticles 116. Sizes of the first, second and third nanoparticles 112, 114 and 116 may be determined depending on a wavelength of light in the surface plasmon resonance. In embodiments, refractive indexes of first to third overcoat layers 122, 124 and 126, which may be formed later, may be measured, and then the sizes of the first, second and third nanoparticles 112, 114 and 116 may be adjusted. Additionally, size distributions of the first, second and third nanoparticles 112, 114 and 116 may be adjusted to control a width of the wavelength of light in the surface plasmon resonance. In embodiments, the amount of the first, second and third nanoparticles may be about 0.2 wt % of the coating solution.

The coating solution may be coated on the first substrate 100 by a spray coating process, a slit coating process or a spin coating process to form the coating layer 119. For example, the coating solution may be coated on the first substrate 100 by a spin coating process at a rotating speed of about 1000 rpm, thereby to form the coating layer 119.

By above-mentioned coating process, the coating layer 119 may be substantially uniformly formed on the first substrate 100. That is, the coating layer 119 having substantially uniform composition and thickness may be formed in the first sub-pixel region I, the second sub-pixel region II and the third sub-pixel region III, simultaneously. Therefore, the process for forming the coating layer 119 may be simplified compared to forming coating layers containing different nanoparticles in the first, second and third sub-pixel regions I, II and III, respectively. In embodiments, although the coating layer 119 may include the first to third nanoparticles 112, 114 and 116, the first nanoparticles 112 in the first sub-pixel region I may resonate with red light to improve an optical efficiency of the red light, and the second nanoparticles 114 and the third nanoparticles 116 in the first sub-pixel region I may not resonate with the red light. The second nanoparticles 114 in the second sub-pixel region II may resonate with green light, and the first nanoparticles 112 and the third nanoparticles 116 may not resonate with the green light. Accordingly, the first, second and third nanoparticles 112, 114 and 116 may be formed in the first, second and third sub-pixel regions I, II and III by a single coating process, so that the coating process may be simplified.

Figure 6:
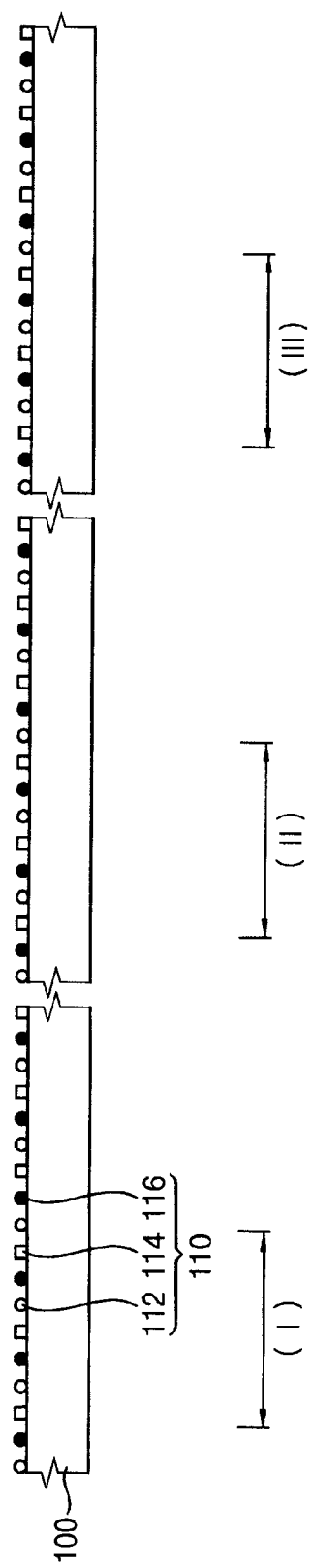

Referring to FIG. 6, a solvent 118 of the coating layer 119 may be volatilized by a baking process. For example, the first substrate 100 having the coating layer 119 may be heated for about 2 minutes at a temperature of about 60° C. to remove the solvent 118 from the coating layer 119. Therefore, a nanoparticle structure 110 including the first, second and third nanoparticles 112, 114 and 116 may be formed on the first substrate 100.

Figure 7:
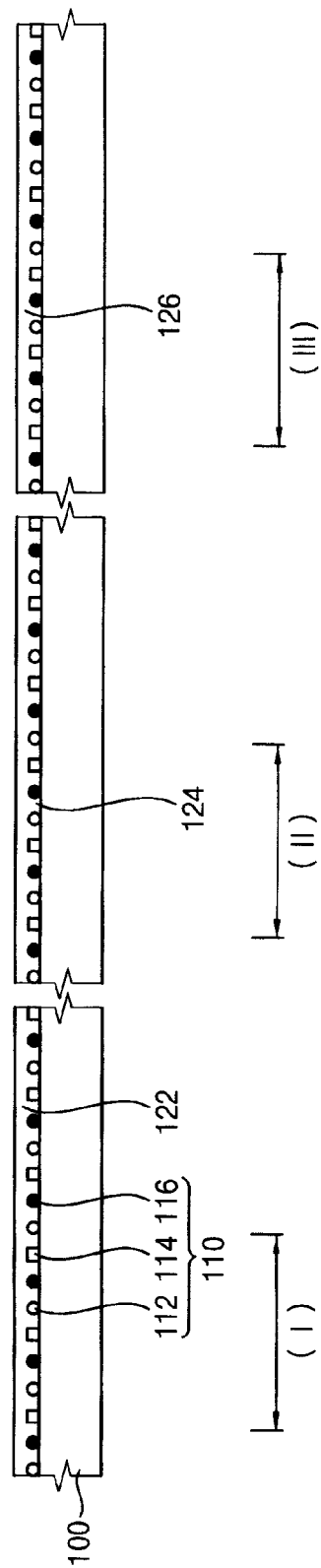

Referring to FIG. 7, first to third overcoat layers 122, 124 and 126 may be formed on the first substrate 100 in the first to third sub-pixel regions I, II and III, respectively, to cover the nanoparticle structure 110. For example, the first overcoat layer 122, the second overcoat layer 124 and the third overcoat layer 126 may be formed using a siloxane based organic material, a siloxane based organic material combined with a metal, a metaloxane based organic material and/or a combination thereof. The materials of the first, second and third overcoat layers 122, 124 and 126 may vary depending on predetermined wavelengths of light in the surface plasmon resonance. When refractive indexes of the first, second and third overcoat layers 122, 124 and 126 increases, the wavelength of light in the surface plasmon resonance may increase. That is, the refractive indexes of the first, second and third overcoat layers 122, 124 and 126 may be adjusted to control the wavelength of light in the surface plasmon resonance.

Figure 8:
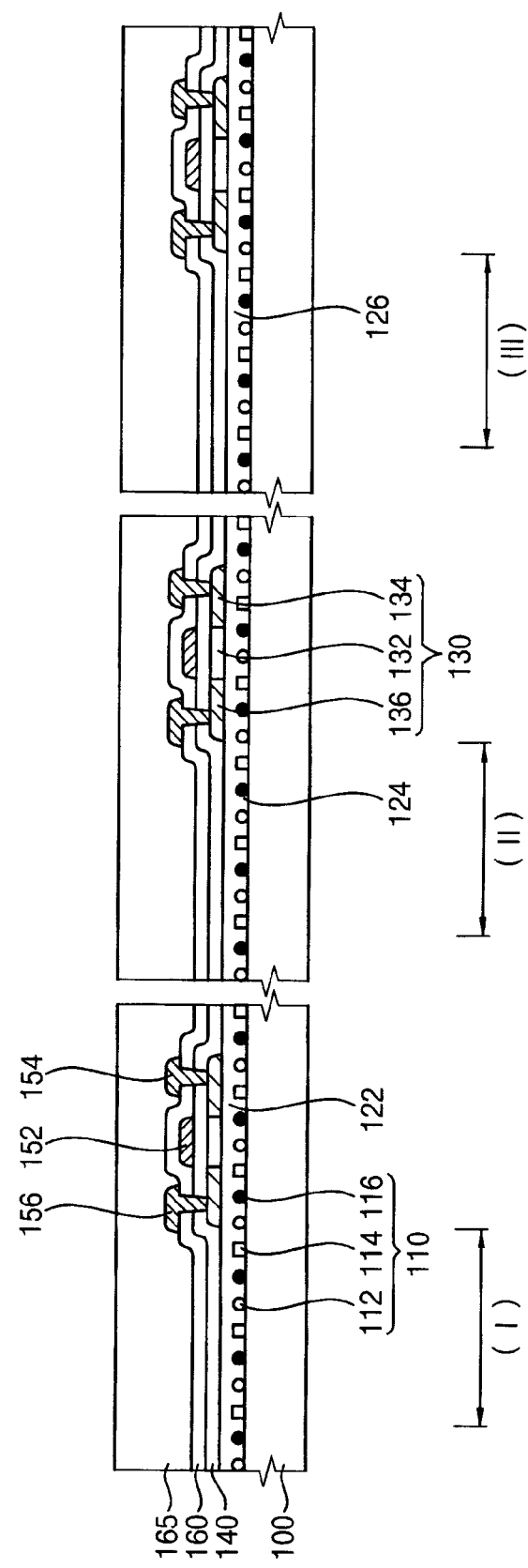

Referring to FIG. 8, a switching structure may be formed on the first, second and third overcoat layers 122, 124 and 126.

In embodiments, a semiconductor layer 130 may be formed on the first, second and third overcoat layers 122, 124 and 126, and then a gate insulation layer 140 may be formed on the first, second and third overcoat layers 122, 124 and 126 to cover the semiconductor layer 130. The semiconductor layer 130 may be formed using silicon, and the gate insulation layer 140 may be formed using an oxide material or an organic insulation material.

A gate electrode 152 may be formed on a portion of the gate insulation layer 140, where the semiconductor layer 130 may be positioned below, using a metal, a metal nitride, a conductive metal oxide, a transparent conductive material, etc. Impurities may be implanted using the gate electrode 152 as a mask, thereby to form a source region 134 and a drain region 136 at both side portions of the semiconductor layer 130. Therefore, a portion of the semiconductor layer 130 between the source region 134 and the drain region 136 may be defined as a channel region 132. For example, the source region 134 and the drain region 136 may be formed by an ion implantation process.

A first insulation layer 160 may be formed on the gate insulation layer 140 using an oxide, a nitride, an oxy-nitride and/or an organic insulation material, thereby to cover the gate electrode 152. The first insulation layer 160 may be partially removed to form holes exposing the source region 134 and the drain region 136, respectively, and then a source electrode 154 and a drain electrode 156 may be formed on the first insulation layer 160 to fill the holes, respectively.

Referring now to FIG. 8, a second insulation layer 165 may be formed on the first, second and third overcoat layers 122, 124 and 126 to cover the switching structure. In this case, the second insulation layer 165 may have a single layer structure or a multi layer structure. In some embodiments, an upper surface of the second insulation layer 165 may be polarized by a chemical mechanical polishing (CMP) process and/or an etch-back process.

Figure 9:
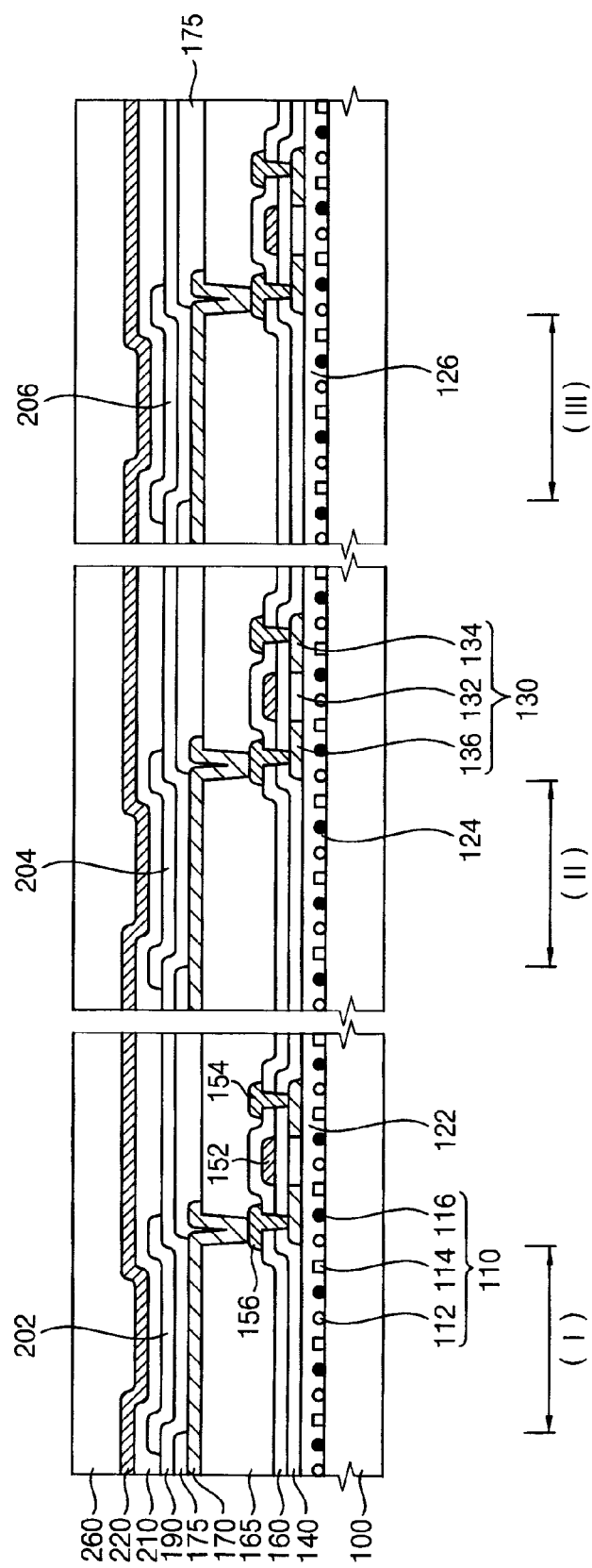

Referring to FIG. 9, a first electrode 170, a light emitting structure, a second electrode 220 and a second substrate 260 may be formed on the second insulation layer 165.

In embodiments, the second insulation layer 165 may be partially removed to form a hole partially exposing a drain electrode 156. The first electrode 170 electrically contacting the drain electrode 156 may be formed to fill the hole. A pixel defining layer 175 may be formed on the second insulation layer 165 in a region where the first electrode 170 may not be disposed.

The light emitting structure including a hole transfer layer 190, first to third organic light emitting layers 202, 204 and 206, and an electron transfer layer 210 may be formed on the first electrode 170 by a spin coating process, a slit coating process or a printing process. In embodiments, the first organic light emitting structure 202 may emit red light in the first sub-pixel region I, the second organic light emitting structure 204 may emit green light in the second sub-pixel region II, and the third organic light emitting structure 206 may emit blue light in the third sub-pixel region III.

The second electrode 220 may be formed on the light emitting structure using a transparent conductive material, and then a second substrate 260 may be formed above the second electrode 220. For example, the second substrate 260 may contact the second electrode 220, or may not contact the second electrode 220.

Table 1 shows optical efficiencies and color coordinates of a conventional organic light emitting display device and an organic light emitting display device including a nanoparticle structure.

Example

A coating solution was prepared to include nanoparticles having an average diameter of about 20 nm and containing silver. In the process of forming the coating solution, dihydric alcohol such as butyl alcohol was used as a solvent, and the nanoparticles were added at a concentration of about 0.2 wt % of the coating solution. By a spin coating process, the coating solution was coated on a capping layer of an organic light emitting display device having a top emission type. In this case, the organic light emitting display device included an organic light emitting layer which emits blue light. The organic light emitting display device was heated for about 2 minutes at a temperature of about 60° C. so that a solvent was removed from the coating solution to obtain a nanoparticle structure on the capping layer.

Comparative Example

An organic light emitting display device was provided. The organic light emitting display device included an organic light emitting layer emitting blue light, and had a top emission type. A nanoparticle structure and overcoat layers were not formed on a capping layer in the Comparative Example.

The optical efficiency and the color coordinates of the organic light emitting display devices in accordance with the Example and the Comparative Example were measured. The optical efficiency was defined as a brightness of light emitted form the organic light emitting display device, when a constant current is applied to the organic light emitting display device. That is, the optical efficiency (cd/A) is defined as the brightness of light (candela) divided by the current (ampere).

| No. | Thickness of capping layer | Comparative Example | | | Example | | |
|---|---|---|---|---|---|---|---|
| | | Optical efficiency (cd/A) | CIE_x | CIE_y | Optical efficiency (cd/A) | CIE_x | CIE_y |
| 1 | 120 nm | 1.07 | 0.140 | 0.004 | 1.42 | 0.139 | 0.057 |
| 2 | 120 nm | 0.85 | 0.14 | 0.040 | 1.40 | 0.140 | 0.050 |
| 3 | 120 nm | 1.03 | 0.140 | 0.046 | 1.35 | 0.140 | 0.050 |
| 4 | 140 nm | 2.30 | 0.135 | 0.055 | 2.95 | 0.139 | 0.051 |

As shown in Table 1, the organic light emitting display device in accordance with the Example had an improved optical efficiency that is 30% larger than the organic light emitting display device in accordance with Comparative Example. Therefore, an improvement of the optical efficiency by the surface plasmon resonance at the nanoparticle structure was experimentally confirmed.

According to embodiments, an organic light emitting display device including a nanoparticle structure may have an improved optical efficiency and a simplified structure. The organic light emitting display device may be widely employed in various electronic and electric apparatuses such as televisions, mobile communication apparatuses, monitors, MP3 players or portable display apparatuses.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An organic light emitting display device comprising:
a substrate;
a first electrode disposed over the substrate;
a light emitting structure disposed over the first electrode;
a second electrode disposed over the light emitting structure; and
a plurality of nanoparticles disposed over the second electrode and capable of causing surface plasmon resonance by light, and comprising first nanoparticles and second nanoparticles which are different from the first nanoparticles,
wherein the device comprises a first sub-pixel region and a second sub-pixel region when viewed in a viewing direction perpendicular to the substrate, the first sub-pixel region configured to emit light having a first color and the second sub-pixel region configured to emit light having a second color which is different from the first color,
wherein each of the first and second sub-pixel regions comprises the first and second nanoparticles distributed therein, the first nanoparticles being configured to cause surface plasmon resonance by light having the first color, the second nanoparticles being configured to cause surface plasmon resonance by light having the second color.

2. The organic light emitting display device of claim 1, further comprising a capping layer disposed over the second electrode, wherein the plurality of nanoparticles are disposed over the capping layer.

3. The organic light emitting display device of claim 1, further comprising a capping layer disposed over the second electrode to cover the plurality of nanoparticles, wherein the capping layer has a refractive index determined such that the nanoparticles cause the surface plasmon resonance by the light having the predetermined wavelength.

4. The organic light emitting display device of claim 1, wherein the nanoparticles include at least one selected from the group consisting of gold, silver, copper and silicon oxide.

5. The organic light emitting display device of claim 1, wherein the nanoparticles include at least one selected from the group consisting of sphere-shaped particles, rod-shaped particles and core/shell-shaped particles.

6. The organic light emitting display device of claim 1, wherein at least some of the nanoparticles are arranged to form a single layer.

7. The organic light emitting display device of claim 1, wherein the device further comprises a third sub-pixel region, and the plurality of nanoparticles further include third nanoparticles, and
wherein the first nanoparticles are configured to cause surface plasmon resonance by red light from the first sub-pixel region, wherein the second nanoparticles are configured to cause surface plasmon resonance by green light from the second sub-pixel region, wherein the third nanoparticles are configured to cause surface plasmon resonance by blue light from the third sub-pixel region.

8. The organic light emitting display device of claim 7, wherein the first nanoparticles include rod-shaped particles containing gold, wherein the second nanoparticles include sphere-shaped particles containing silver or copper, or core/shell-shaped particles containing gold as the core and silicon oxide as the shell, wherein the third nanoparticles include sphere-shaped particles containing silver or an alloy of silver and gold.

9. An organic light emitting display device comprising:
a substrate;
a first electrode disposed over the substrate;
a light emitting structure disposed over the first electrode;
a second electrode disposed over the light emitting structure; and
a plurality of nanoparticles disposed between the substrate and the light emitting structure and capable of causing surface plasmon resonance by light, and comprising first nanoparticles and second nanoparticles which are different from the first nanoparticles, and
an overcoat layer positioned to cover the plurality of nanoparticles, wherein the device comprises a first sub-pixel region and a second sub-pixel region when viewed in a viewing direction perpendicular to the substrate, the first sub-pixel region configured to emit light having a first color and the second sub-pixel region configured to emit light having a second color which is different from the first color, wherein each of the first and second sub-pixel regions comprises the first and second nanoparticles distributed therein, the first nanoparticles being configured to cause surface plasmon resonance by light having the first color, the second nanoparticles being configured to cause surface plasmon resonance by light having the second color.

10. The organic light emitting display device of claim 9, wherein the overcoat layer includes at least one selected from the group consisting of a siloxane based organic material, a siloxane based organic material combined with a metal, and a metaloxane based organic material.

11. The organic light emitting display device of claim 9, wherein the plurality of nanoparticles are disposed between the substrate and the first electrode.

12. The organic light emitting display device of claim 9, wherein the plurality of nanoparticles are disposed between the first electrode and the light emitting structure.

13. The organic light emitting display device of claim 9, wherein the nanoparticles include at least one selected from the group consisting of gold, silver, copper and silicon oxide, wherein the nanoparticles include at least one selected from the group consisting of sphere-shaped particles, rod-shaped particles and core/shell-shaped particles, wherein the nanoparticles are arranged to form a single layer.

14. The organic light emitting display device of claim 9, wherein the device further comprises a third sub-pixel region, and the plurality of nanoparticles further include third nanoparticles, and wherein the first nanoparticles include rod-shaped particles containing gold to cause surface plasmon resonance by red light from the first sub-pixel region, wherein the second nanoparticles include sphere-shaped particles containing silver or copper, or core/shell-shaped particles containing gold and silicon oxide to cause surface plasmon resonance by green light from the second sub-pixel region, wherein the third nanoparticles include sphere-shaped particles containing silver or an alloy of silver and gold to cause surface plasmon resonance by blue light from the third sub-pixel region.

15. The organic light emitting display device of claim 1, wherein the first nanoparticles are uniformly distributed in the first and second sub-pixel regions.

16. The organic light emitting display device of claim 1, wherein the first nanoparticles are configured not to cause surface plasmon resonance by light having the second color.

17. The organic light emitting display device of claim 9, wherein the first nanoparticles are uniformly distributed in the first and second sub-pixel regions.

18. The organic light emitting display device of claim 9, wherein the first nanoparticles are configured not to cause surface plasmon resonance by light having the second color.

19. The organic light emitting display device of claim 1, wherein the first nanoparticles are uniformly distributed in the first and second sub-pixel regions and the second nanoparticles are uniformly distributed in the first and second sub-pixel regions.

* * * * *